(12) United States Patent
Fujita

(10) Patent No.: US 8,274,117 B2
(45) Date of Patent: Sep. 25, 2012

(54) METHOD FOR MANUFACTURING SEMICONDUCTOR DEVICE, AND SEMICONDUCTOR DEVICE

(75) Inventor: Kazushi Fujita, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 445 days.

(21) Appl. No.: 12/500,277

(22) Filed: Jul. 9, 2009

(65) Prior Publication Data

US 2010/0013023 A1    Jan. 21, 2010

(30) Foreign Application Priority Data

Jul. 10, 2008  (JP) .................................. 2008-179964

(51) Int. Cl.
*H01L 29/76* (2006.01)
(52) U.S. Cl. ................. 257/369; 257/E27.064
(58) Field of Classification Search .................. 257/204, 257/369, 692, E27.064
See application file for complete search history.

(56) References Cited

U.S. PATENT DOCUMENTS

| 7,427,544 | B2 | 9/2008 | Oishi |
| 7,534,678 | B2 | 5/2009 | Lee et al. |
| 7,642,148 | B2 * | 1/2010 | Nam et al. ..................... 438/200 |
| 2007/0252214 | A1 | 11/2007 | Zhu et al. |
| 2007/0252230 | A1 * | 11/2007 | Zhu et al. ...................... 257/499 |

FOREIGN PATENT DOCUMENTS

| JP | 2007-173466 | 7/2007 |
| JP | 2007-300090 | 11/2007 |

OTHER PUBLICATIONS

USPTO, (Hoang) Notice of Allowance and Notice of Allowability, Apr. 16, 2012, in the child U.S. Appl. No. 13/354,344 [now allowed].

* cited by examiner

*Primary Examiner* — Quoc Hoang
(74) *Attorney, Agent, or Firm* — Fujitsu Patent Center

(57) ABSTRACT

A semiconductor device includes a first MISFET having a first conduction type channel and formed on a semiconductor substrate; a second MISFET having a second conduction type channel and formed on the semiconductor substrate; a first strain film having a first sign strain that covers a region where the second MISFET is disposed; and a second strain film having a second sign strain that covers a region where the first MISFET is disposed. In the semiconductor device, an edge of the second strain film closer to the second MISFET overlaps with part of the first strain film; and the second strain film at a portion where the second strain film overlaps with the first strain film and at a portion extending from the portion, is thinner than the second strain film at a portion that covers the first MISFET.

4 Claims, 13 Drawing Sheets

METHOD FOR MANUFACTURING SEMICONDUCTOR DEVICE, AND SEMICONDUCTOR DEVICE

CROSS-REFERENCE TO RELATED APPLICATIONS

This application is based upon and claims the benefit of priority of the prior Japanese Patent Application No. 2008-179964, filed on Jul. 10, 2008, the entire contents of which are incorporated herein by reference.

FIELD

The present invention relates to a method for manufacturing a semiconductor device in which carrier mobility can be improved.

BACKGROUND

Carrier mobility can be improved by producing a tensile strain and a compressive strain in channel regions of an n-channel metal-insulator-semiconductor field-effect transistor (MISFET) and a p-channel MISFET, respectively. A desired strain can be produced in a channel region by disposing a film having a compressive or tensile strain on a MISFET.

SUMMARY

According to aspects of the embodiments disclosed herein, there is a semiconductor device including a semiconductor substrate; a first MISFET having a channel of a first conduction type and formed on the semiconductor substrate; a second MISFET having a channel of a second conduction type that is opposite to the first conduction type and formed on the semiconductor substrate; a first strain film having a strain of a first sign, the first strain film covering a region where the second MISFET is disposed but not a region where the first MISFET is disposed; and a second strain film having a strain of a second sign that is opposite to the first sign, the second strain film covering the region where the first MISFET is disposed but not the region where the second MISFET is disposed. In the semiconductor device, an edge of the second strain film closer to the second MISFET overlaps with a part of the first strain film; and the second strain film at a portion where the second strain film overlaps with the first strain film and at a portion extending from the portion where the second strain film overlaps with the first strain film, is thinner than the second strain film at a portion that covers the first MISFET.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

To dispose a strain film having a tensile strain on an n-channel MISFET and a strain film having a compressive strain on a p-channel MISFET, a tensile strain film and a compressive strain film may be patterned. If positional displacement occurs when the two strain films may be patterned, an overlap of the two strain films or a space between the two strain films may be created at the boundary between the region where the n-channel MISFET may be disposed and the region where the p-channel MISFET is disposed.

In the case where an overlap of the two strain films may be created, insufficient etching tends to be conducted when via holes may be formed in the overlap. The insufficient etching of via holes causes defective contact. In the case where a space between the two strain films may be created, a base surface exposed under the space is damaged in a wet process, etc. conducted after patterning of the strain films. For example, if wiring intersecting with the space is formed with a metal silicide or the like under the strain films, the wiring is damaged and the wiring resistance increases.

First to fifth embodiments will now be described.

First Embodiment

A method for manufacturing a semiconductor device according to a first embodiment will be described with reference to FIGS. 1A to 1N and 1P to 1R.

Figure 1A:
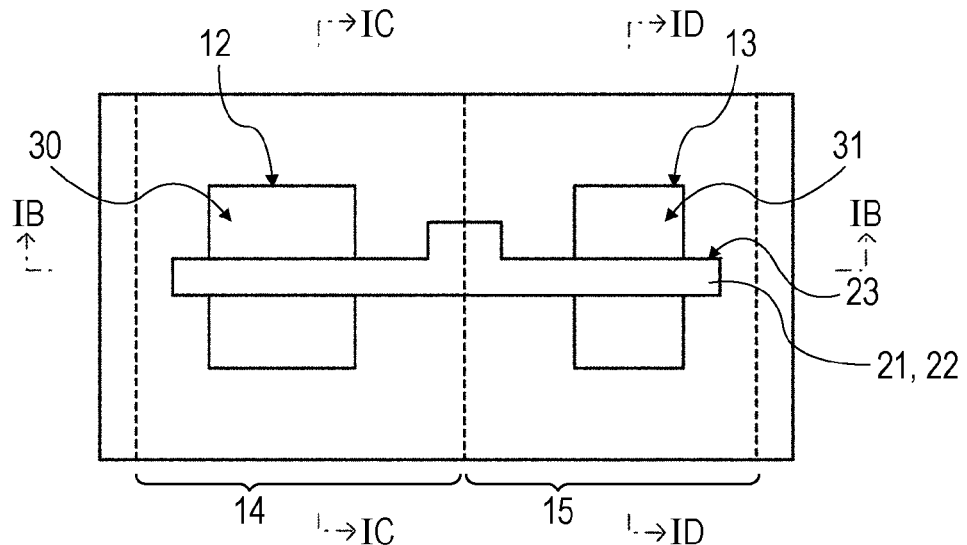
FIGS. 1A to 1N and 1P to 1R are views for describing a method for manufacturing a semiconductor device according to a first embodiment.
Figure 1B:
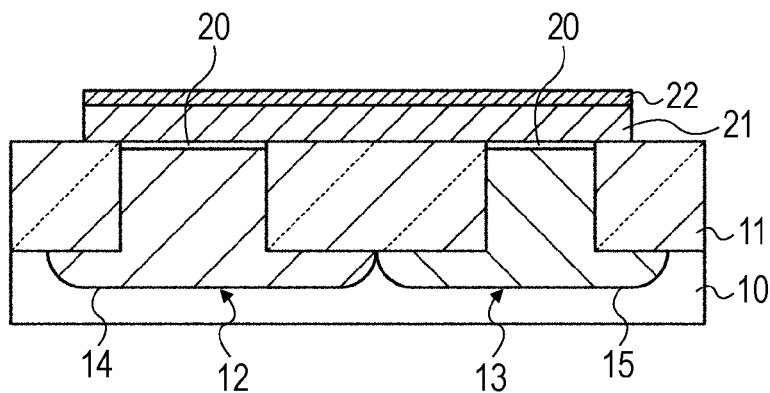
Figure 1C:
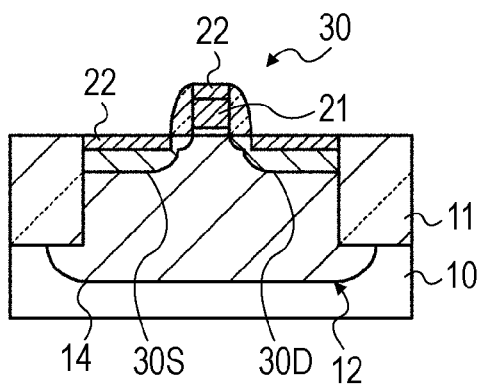
Figure 1D:
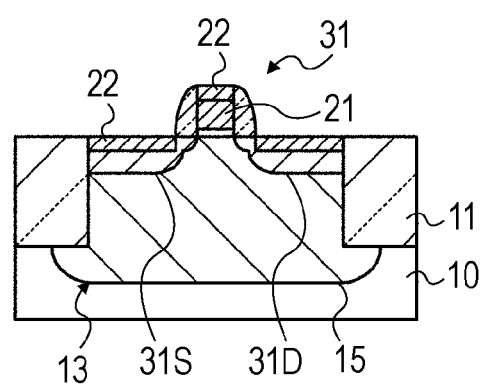

FIG. 1A is a plan view of the semiconductor device that is still being manufactured. FIGS. 1B to 1D are sectional views respectively taken along chain lines IB-IB, IC-IC, and ID-ID of FIG. 1A. An element isolation insulating film 11 is formed on a surface layer of a semiconductor substrate 10 made of a material such as silicon, by shallow trench isolation (STI), etc. The element isolation insulating film 11 defines a p-channel MISFET active region (PMOS active region) 12 and an n-channel MISFET active region (NMOS active region) 13. The PMOS active region 12 is disposed in an n-type well 14 and the NMOS active region 13 is disposed in a p-type well 15.

The PMOS active region 12 and the NMOS active region 13, each having, for example, a rectangular shape when viewed in plan, may be disposed so as to be separated by the element isolation insulating film 11 in an in-plane direction.

A p-channel MISFET (PMOSFET) 30 is formed in the PMOS active region 12 and an n-channel MISFET (NMOSFET) 31 is formed in the NMOS active region 13. The PMOSFET 30 includes a gate insulating film 20, a gate electrode 21, a source 30S, and a drain 30D. The NMOSFET 31 includes a gate insulating film 20, a gate electrode 21, a source 31S, and a drain 31D.

The gate electrode 21 of the PMOSFET 30 and the gate electrode 21 of the NMOSFET 31 have a single gate pattern 23 composed of, for example, polysilicon. The gate pattern 23 extends so as to intersect with the PMOS active region 12 and the NMOS active region 13. Thus, the gate pattern 23 also intersects with the boundary between the n-type well 14 and the p-type well 15. At the position where the gate pattern 23 intersects with the boundary, the gate pattern 23 has a wider area because via holes may be formed in that area.

The structure in FIGS. 1A to 1D may be formed by existing film formation, etching, photolithography, and ion implantation, etc.

Metal silicide films 22 may be formed on the gate electrode 21, the sources 30S and 31S, and the drains 30D and 31D. The metal silicide films 22 composed of, for example, NiSi, CoSi, or TiSi are formed by a self-aligned silicide process (salicide process). One example of the method for forming the metal silicide films 22 is described hereinafter.

Natural oxide films formed on the surfaces of the gate electrode 21, the sources 30S and 31S, and the drains 30D and 31D may be removed by etching using dilute hydrofluoric acid. For example, a nickel (Ni) film having a thickness of about 10 nm may be deposited by direct current (DC) sputtering. First annealing may be then conducted at 400° C. for 60 seconds, for example. As a result, nickel silicide may be formed at an interface between silicon and nickel. Subsequently, an unreacted excess nickel film may be removed using a mixed chemical solution of sulfuric acid and hydrogen peroxide by etching. Second annealing may be then conducted at 500° C. for 60 seconds, for example. Consequently, the metal silicide films 22 composed of NiSi may be formed.

FIGS. 1E to 1M are sectional views each corresponding to the sectional view taken along chain line IB-IB of FIG. 1A.

Figure 1E:
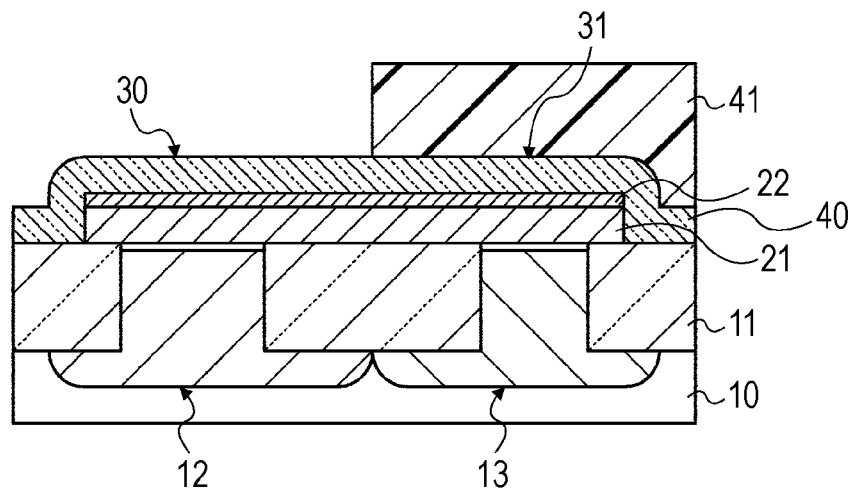

Referring to FIG. 1E, a tensile strain film 40 made of a material such as silicon nitride may be formed on the semiconductor substrate 10 by, for example, thermal chemical vapor deposition (thermal CVD), so as to cover the PMOSFET 30 and NMOSFET 31. In general, a SiN film formed by thermal CVD has a tensile strain. The thickness of the tensile strain film 40 may be about 80 nm. For example, the film-forming conditions may be as follows.

Substrate temperature: 400 to 700° C.
Pressure: 13 Pa to 53 kPa (0.1 to 400 Torr)
Si source: $SiH_2Cl_2+SiH_4+Si_2H_6$ (5 to 60 sccm)
N source: $NH_3$ (500 to 10000 sccm)
Carrier gas: $N_2$+Ar (500 to 1000 sccm)

A mask pattern 41 that covers the NMOS active region 13 but not the PMOS active region 12 may be formed using a photoresist. Part of the edge of the mask pattern 41 extends over the element isolation insulating film 11 between the PMOS active region 12 and the NMOS active region 13. For example, part of the edge of the mask pattern 41 may be disposed at a position where the distance from the PMOS active region 12 may be substantially the same as that from the NMOS active region 13.

Figure 1F:
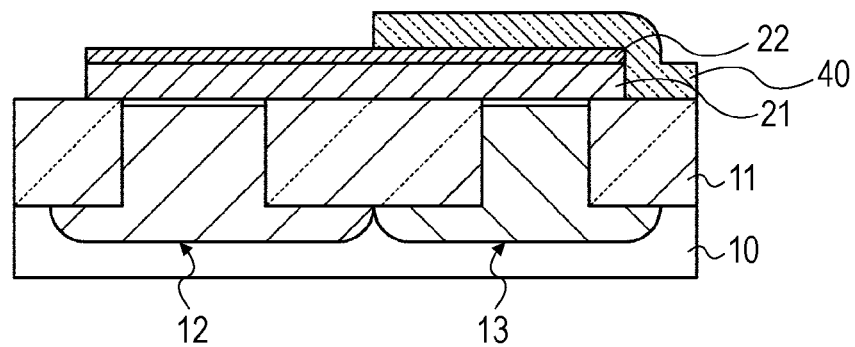

Referring to FIG. 1F, the tensile strain film 40 may be etched using the mask pattern 41 as an etching mask. A parallel-plate plasma etching apparatus, etc. may be used to etch the tensile strain film 40. For example, the etching conditions may be as follows.

Gas: $CHF_3$ (20 to 100 sccm)+$O_2$ (100 to 300 sccm)
Pressure: 6.7 to 27 Pa (50 to 200 mTorr)
RF power: 100 to 1000 W The tensile strain film 40 in a region where the PMOSFET 30 may be disposed is removed while the tensile strain film 40 in a region where the NMOSFET 31 may be disposed is left. After the etching of the tensile strain film 40, the mask pattern 41 may be removed.

Figure 1G:
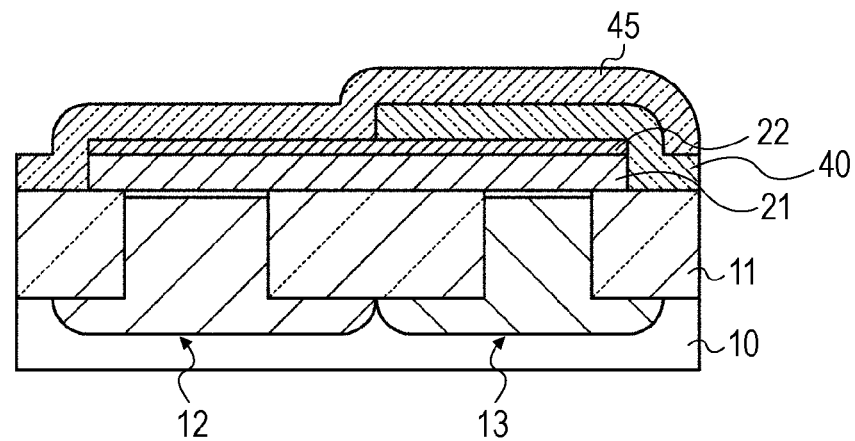
Figure 1H:
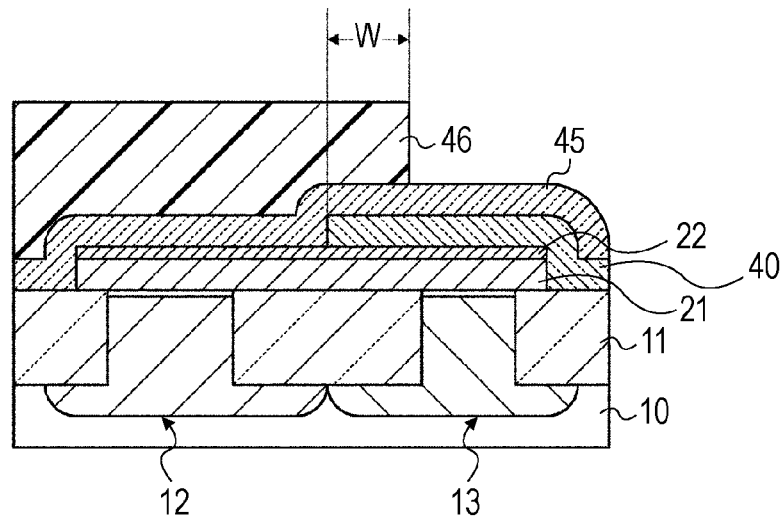

Referring to FIG. 1G, a compressive strain film 45 made of silicon nitride may be formed on the semiconductor substrate 10 by, for example, plasma-enhanced chemical vapor deposition (PE-CVD), so as to cover the patterned tensile strain film 40. In general, a SiN film formed by PE-CVD has a compressive strain. The thickness of the compressive strain film 45 may be about 80 nm. For example, the film-forming conditions may be as follows.

Substrate temperature: 400 to 700° C.
Pressure: 13 Pa to 53 kPa (0.1 to 400 Torr)
Si source: $SiH_4$ (100 to 1000 sccm)
N source: $NH_3$ (500 to 10000 sccm)
Carrier gas: $N_2$+Ar (500 to 10000 sccm)
RF power: 100 to 1000 W Referring to FIG. 1H, a mask pattern 46 that covers the PMOS active region 12 but not the NMOS active region 13 may be formed on the compressive strain film 45 using a photoresist. The mask pattern 46 overlaps with part of the tensile strain film 40 closer to the PMOS active region 12, but not with the NMOS active region 13. The overlap width W from the edge of the tensile strain film 40 to the end of the mask pattern 46 may be designed to be larger than the allowable range of the positional displacement. Thus, even if the positional displacement of the mask pattern 46 relative to the tensile strain film 40 occurs, the overlap remains.

Figure 1I:
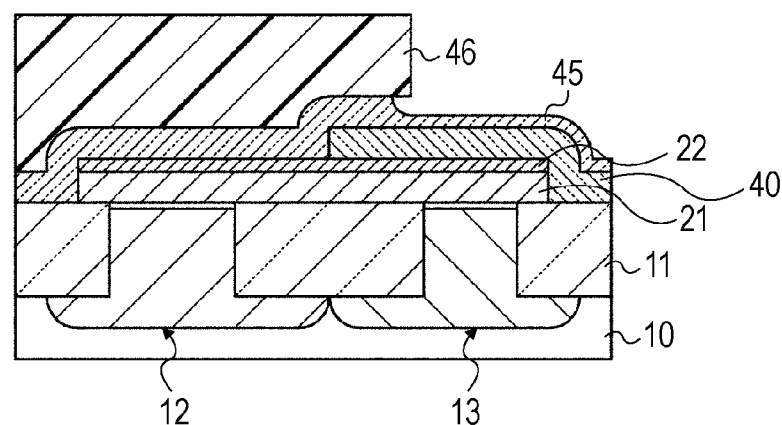

Referring to FIG. 1I, the compressive strain film 45 may be etched to the intermediate position in the thickness direction thereof using the mask pattern 46 as an etching mask. For example, a microwave downflow plasma etching apparatus may be used to etch the compressive strain film 45. For example, the etching conditions may be as follows.

Gas: $CF_4$ (100 to 500 sccm)+$O_2$ (100 to 500 sccm)
Pressure: 20 to 100 Pa
Microwave power: 200 to 800 W As a result, the compressive strain film 45 in a region where the mask pattern 46 does not cover becomes thin. The depth of etching the compressive strain film 45 may be about 50% of the thickness of the original compressive strain film 45. Subsequently, the mask pattern 46 may be removed.

Figure 1J:
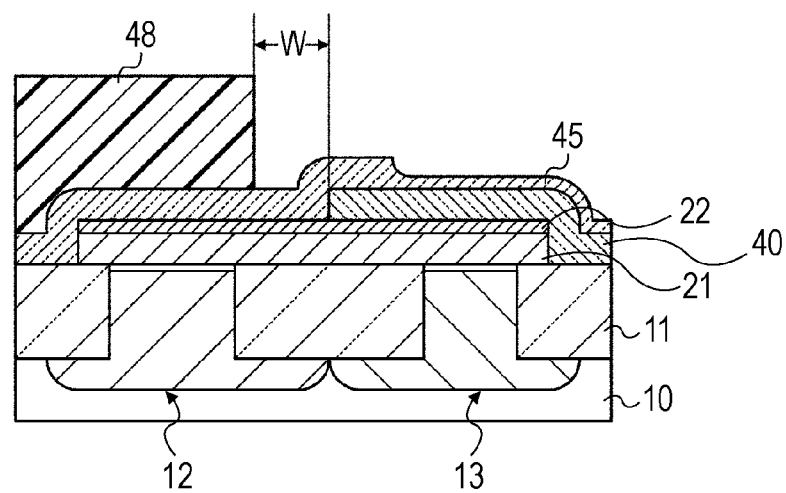

Referring to FIG. 1J, a mask pattern 48 that covers the PMOS active region 12 but not the NMOS active region 13 may be formed on the compressive strain film 45 using a photoresist. The mask pattern 48 may be disposed so as to be separated from the edge of the tensile strain film 40 in the in-plane direction, that is, so as not to overlap with the tensile strain film 40. The space W from the edge of the tensile strain film 40 to the end of the mask pattern 48 may be designed to be larger than the allowable range of the positional displacement. Thus, even if the positional displacement of the mask pattern 48 relative to the tensile strain film 40 occurs, both of them do not overlap with each other.

Figure 1K:
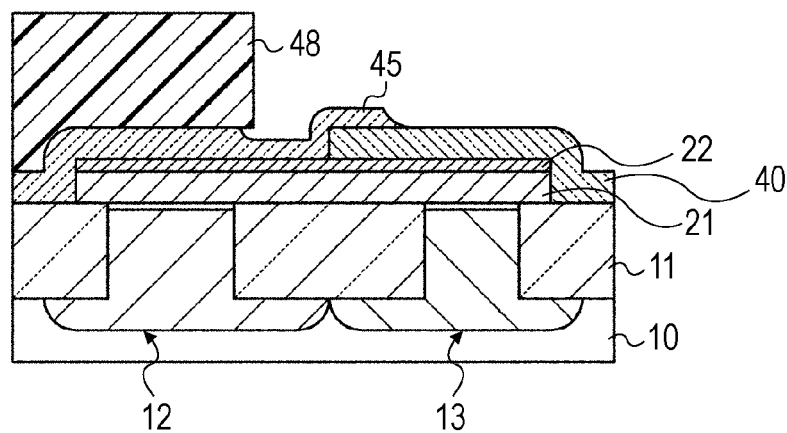

Referring to FIG. 1K, the compressive strain film 45 may be etched using the mask pattern 48 as an etching mask. The etching conditions may be substantially the same as those of the first etching of the compressive strain film 45 conducted in FIG. 1I, except for etching time. All the portion thinned by the first etching of the compressive strain film 45 may be removed to expose the tensile strain film 40 formed under the compressive strain film 45. In this case, etching may be stopped before the portion of the compressive strain film 45 that has been covered with the mask pattern 46 during the first etching but is not covered with the mask pattern 48 at this point may be completely removed. Thus, the edge of the tensile strain film 40 and its surrounding area may be still covered with the compressive strain film 45. However, the portion of the compressive strain film 45 that covers the edge of the tensile strain film 40 and its surrounding area may be thinner than the portion of the compressive strain film 45 that is covered with the mask pattern 48. The mask pattern 48 may be then removed.

Figure 1L:
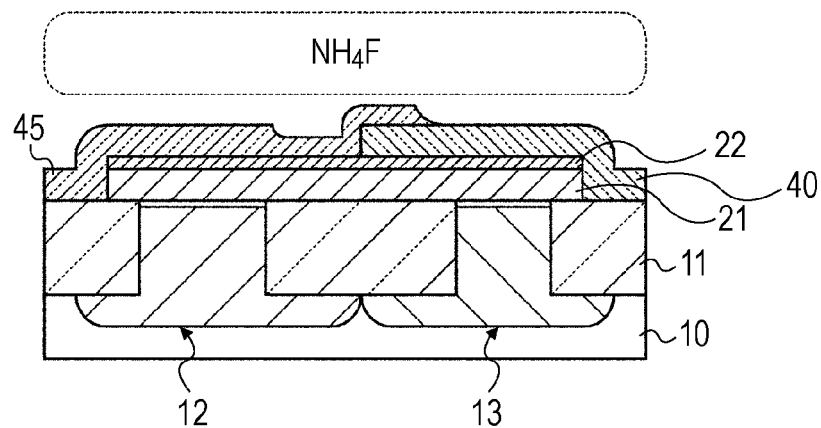

Referring to FIG. 1L, wet processing may be conducted on the surfaces of the tensile strain film 40 and the compressive strain film 45 using an aqueous ammonium fluoride solution. The processing time may be 30 to 120 seconds. Since the edge of the tensile strain film 40 between the PMOS active region 12 and the NMOS active region 13 is covered with the thin compressive strain film 45, the metal silicide film 22 on the gate electrode 21 is not exposed. Therefore, the metal silicide film 22 is not damaged in the wet processing that uses the aqueous ammonium fluoride solution.

Figure 1M:
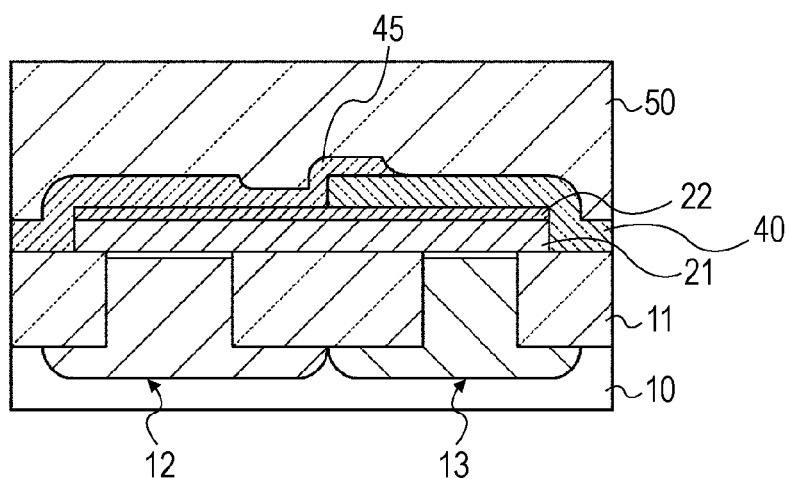

Referring to FIG. 1M, an interlayer insulating film 50 composed of silicon oxide is formed on the tensile strain film 40 and the compressive strain film 45 by, for example, PE-CVD. For example, the film-forming conditions may be as follows.

Figure 1N:
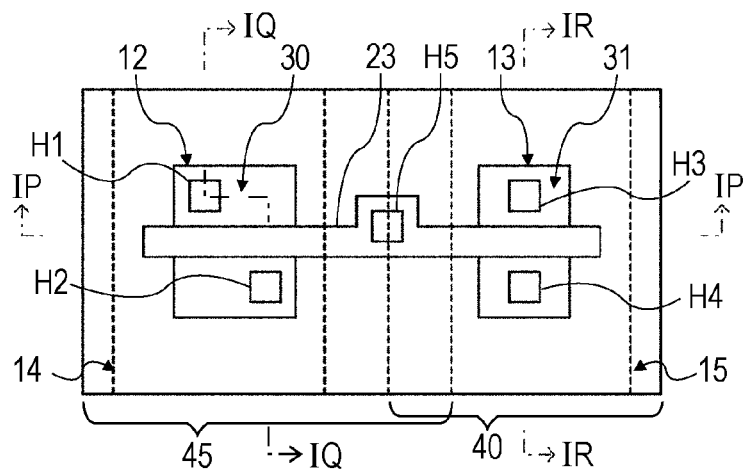
Figure 1P:
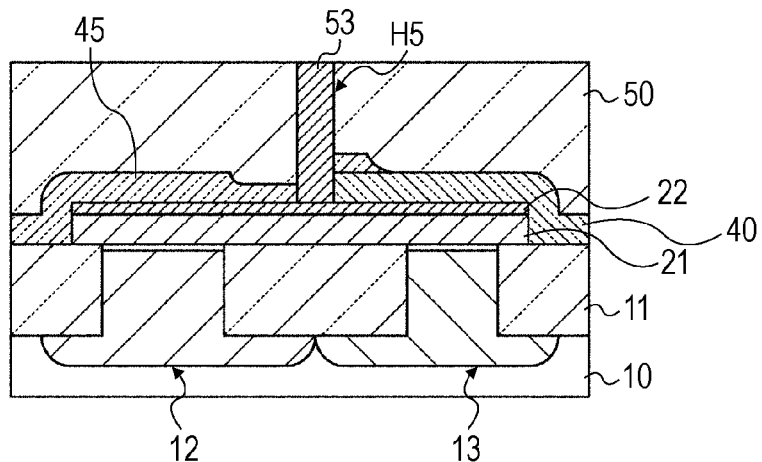
Figure 1Q:
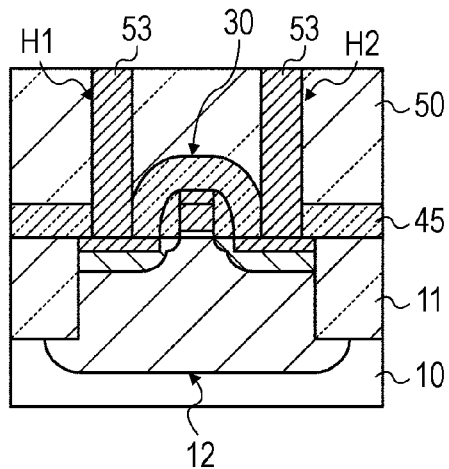
Figure 1R:
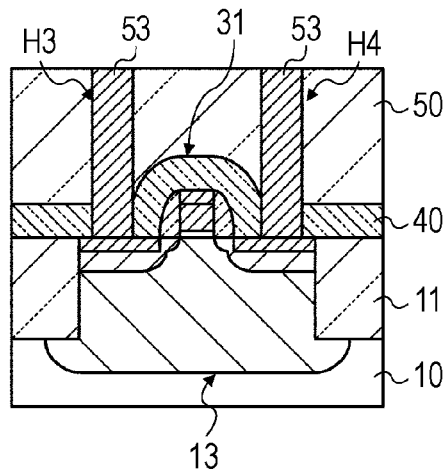

Substrate temperature: 400 to 700° C.
Gas: tetraethyl orthosilicate (TEOS)
Pressure: 13 Pa to 53 kPa FIG. 1N is a plan view of a substrate obtained after via holes H1 to H5 may be formed in the interlayer insulating film 50. FIGS. 1P to 1R are sectional views respectively taken along chain lines IP-IP, IQ-IQ, and IR-IR of FIG. 1N.

Referring to FIG. 1N, via holes H1 and H2 may be disposed in the source 30S and the drain 30D of the PMOSFET 30, respectively. Via holes H3 and H4 are disposed in the source 31S and the drain 31D of the NMOSFET 31, respectively. A via hole H5 may be disposed at a position where the edge of the tensile strain film 40 between the PMOS active region 12 and the NMOS active region 13 intersects with the gate pattern 23.

Referring to FIG. 1P, the via hole H5 extends through the interlayer insulating film 50, the thin portion of the compressive strain film 45, and the tensile strain film 40 and reaches the metal silicide film 22 on the gate electrode 21. Referring to FIG. 1Q, the via holes H1 and H2 extend through the interlayer insulating film 50 and the compressive strain film 45 and reach the metal silicide film 22 on the source 30S and the drain 30D of the PMOSFET 30, respectively. Referring to FIG. 1R, the via holes H3 and H4 extend through the interlayer insulating film 50 and the tensile strain film 40 and reach the metal silicide film 22 on the source 31S and the drain 31D of the NMOSFET 31, respectively.

A parallel-plate plasma etching apparatus, etc. may be used to etch the interlayer insulating film 50, the tensile strain film 40, and the compressive strain film 45 for the purpose of formation of the via holes H1 to H5. For example, the etching conditions of the interlayer insulating film 50 may be as follows.

Gas: $C_4F_6$ (10 to 30 sccm)+$O_2$ (5 to 20 sccm)+Ar (500 to 1000 sccm)
Pressure: 4.0 to 11 Pa (30 to 80 mTorr)
RF power: 2000 to 4000 W For example, the etching conditions of the tensile strain film 40 and the compressive strain film 45 may be as follows.

Gas: $CH_3F$ (30 to 100 sccm)+$O_2$ (10 to 100 sccm)+Ar (100 to 300 sccm)
Pressure: 6.7 to 27 Pa (50 to 200 mTorr)
RF power: 300 to 1000 W After the via holes H1 to H5 are formed, conductive plugs 53 made of a material such as tungsten may be placed in the via holes H1 to H5.

The amount of etching silicon nitride, which constitutes the tensile strain film 40 and the compressive strain film 45, when forming the via holes H1 to H5 will now be described with reference to FIG. 2.

Figure 2:
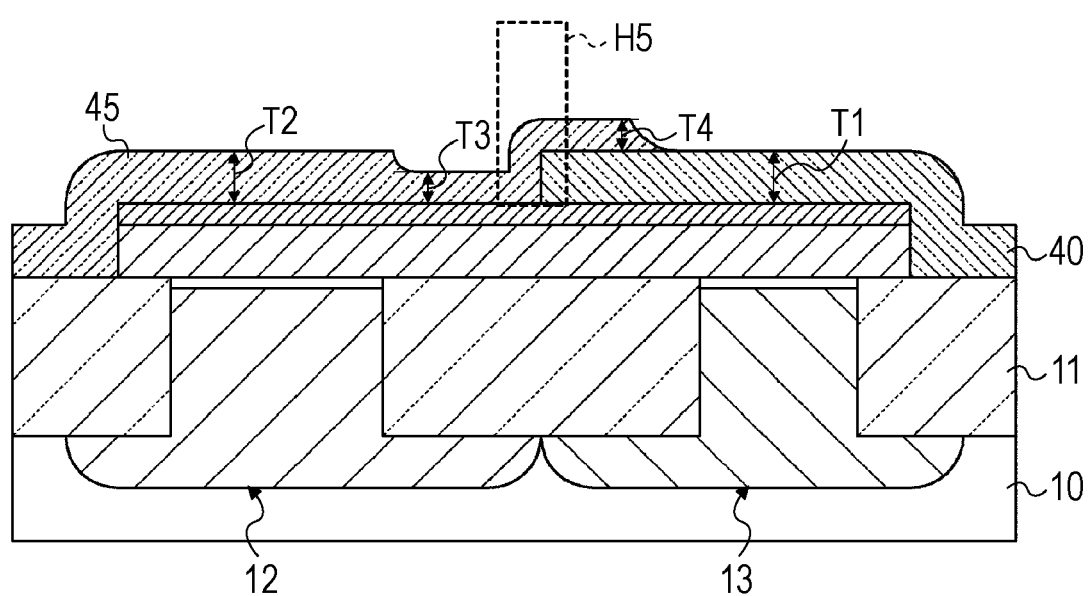
FIG. 2 is a sectional view of the main part of the semiconductor device according to the first embodiment.

FIG. 2 is a sectional view of a semiconductor device according to an embodiment. The thickness of the tensile strain film 40 above the NMOS active region 13 may be T1 and that of the compressive strain film 45 above the PMOS active region 12 may be T2. The thickness of the compressive strain film 45 at a position where the compressive strain film 45 overlaps with the tensile strain film 40 may be T4. The thickness of the thin portion of the compressive strain film 45 that is in contact with the edge of the tensile strain film 40 may be T3.

A silicon nitride film at the positions of the via holes H1 and H2 in FIG. 1Q has a thickness of T2. A silicon nitride film at the positions of the via holes H3 and H4 in FIG. 1R may have a thickness of T1. A silicon nitride film at the position of the via hole H5 in FIG. 2 may have a thickness of T3 to (T1+T4).

The thickness of T1 and T2 may be about 80 nm. To prevent insufficient extension of the via holes H1 to H5, a case where about 80% over-etching may be conducted on the basis of the etching time of the silicon nitride film having a thickness of T1 and T2 may be considered. Ideally, if the thickness T1+T4 may be about 180% or less of the thickness T1, that is, the thickness T4 is about 80% or less of the thickness T1 (e.g., 64 nm or less), the via hole H5 can extend through the portion in which the compressive strain film 45 overlaps with the tensile strain film 40.

However, variation due to the film-forming conditions of the tensile strain film 40 and the compressive strain film 45 causes variation of film thickness and etching rate. This variation is generally about ±5% of a desired value. In consideration of this variation, the thickness T4 is preferably brought to about 70% or less of the thickness T1 (e.g., 56 nm or less).

Ideally, the thickness T4 may be substantially the same as the thickness T3. If the thickness T4 becomes too small, the thickness T3 also becomes small and the metal silicide film 22 under the compressive strain film 45 is more likely to be exposed.

To prevent the compressive strain film 45 from being left above the NMOS active region 13 after the second etching of the compressive strain film 45 in FIG. 1K, the case where about 20% over-etching may be conducted is considered regarding the first etching in FIG. 1I and the second etching in FIG. 1K. As one example, the depth of the first etching may be about 60% of the thickness T2 and the depth of the second etching also may be about 60% of the thickness T2. In this case, the thickness T3 may be about 40% of the thickness T2 (e.g., 32 nm). In consideration of variation due to the film thickness of the compressive strain film 45 and etching rate, the thickness T3 may decrease to about 30% of the thickness T2 (24 nm). However, the thickness T3 does not become 0 nm and the metal silicide film 22 is not exposed.

In the case where the compressive strain film 45 overlaps with the tensile strain film 40 due to the positional displacement, the thickness of the overlap portion may be T1+T2. In this case, even if about 80% over-etching is conducted on the basis of the etching time of the thickness T1, a via hole cannot extend through the overlap portion having a thickness of T1+T2. In this embodiment, insufficient extension of a via hole may be prevented.

Referring to FIG. 1Q, the compressive strain film 45 may be disposed on the PMOSFET 30. Thus, a compressive stress in an in-plane direction may be applied to a channel region of the PMOSFET 30, which produces a compressive strain (negative strain). Referring to FIG. 1R, the tensile strain film 40 may be disposed on the NMOSFET 31. Thus, a tensile stress in an in-plane direction may be applied to a channel region of the NMOSFET 31, which produces a tensile strain (positive strain). Channel mobility may be improved by producing the negative and positive strains in the channel regions of the PMOSFET 30 and the NMOSFET 31, respectively.

Second Embodiment

A method for manufacturing a semiconductor device according to a second embodiment will be described with reference to FIGS. 3A to 3E.

Figure 3A:
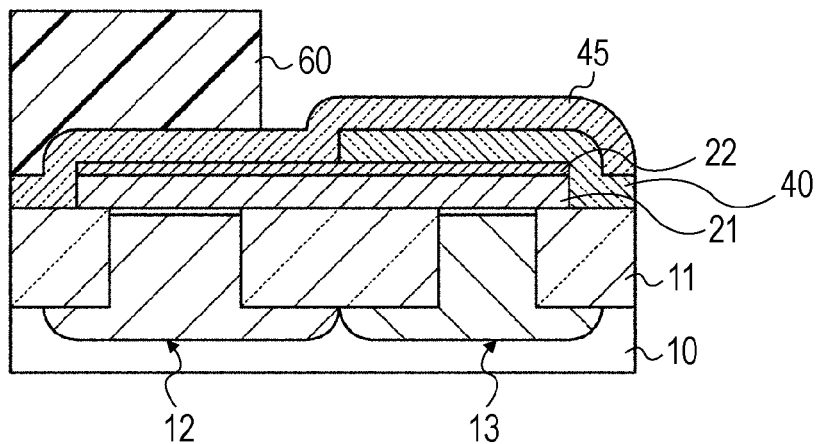
FIGS. 3A to 3E are views for describing a method for manufacturing a semiconductor device according to a second embodiment.

The process conducted until the formation of the compressive strain film 45 in FIG. 3A may be substantially the same as those conducted until the formation of the compressive strain film 45 in FIG. 1G of the first embodiment. In the first embodiment, after the mask pattern 46 that overlaps with the tensile strain film 40 has been formed in FIG. 1H, the mask pattern 48 that does not overlap with the tensile strain film 40 has been formed in FIG. 1J. In the second embodiment, a mask pattern 60 that does not overlap with the tensile strain film 40 is formed first. The region covered with the mask pattern 60 may be substantially the same as the region covered with the mask pattern 48 in FIG. 1J of the first embodiment.

Figure 3B:
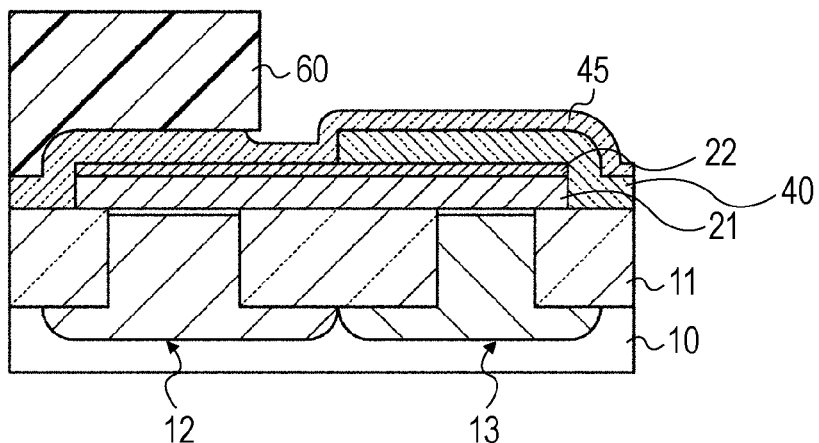

Referring to FIG. 3B, the compressive strain film 45 may be etched to the intermediate position in the thickness direction thereof using the mask pattern 60 as an etching mask. The depth of etching the compressive strain film 45 may be about 50% of the thickness of the original compressive strain film 45. Thus, the compressive strain film 45 in a region that is not covered with the mask pattern 60 becomes thin. The mask pattern 60 may be removed.

Figure 3C:
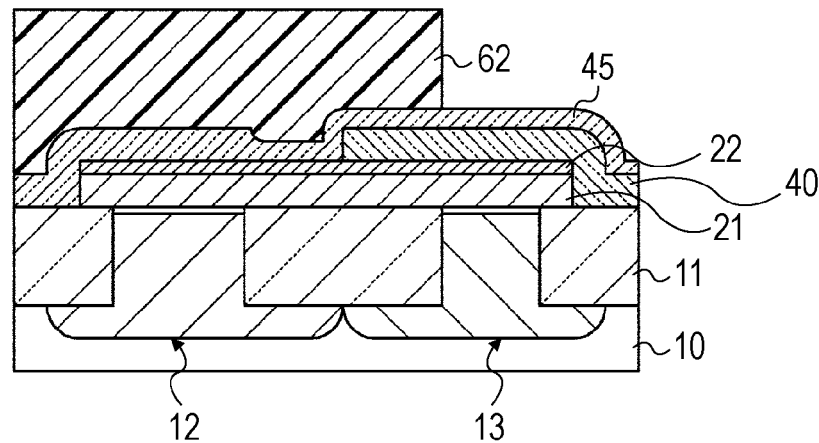

Referring to FIG. 3C, a mask pattern 62 that overlaps with the tensile strain film 40 may be formed on the compressive strain film 45. The region covered with the mask pattern 62 may be substantially the same as the region covered with the mask pattern 46 in FIG. 1H of the first embodiment.

Figure 3D:
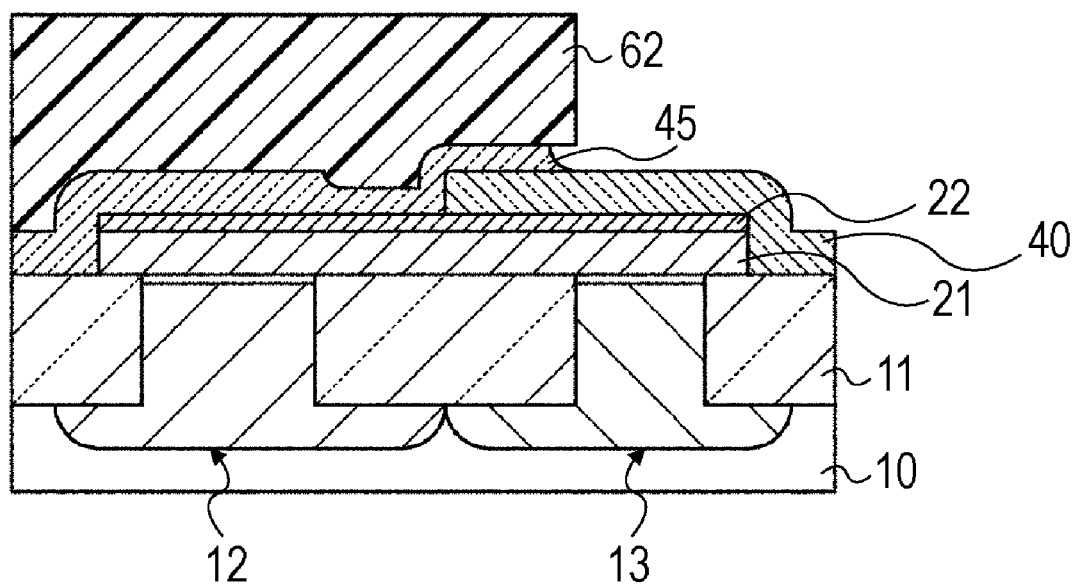

Referring to FIG. 3D, the compressive strain film 45 may be etched using the mask pattern 62 as an etching mask. The tensile strain film 40 may be exposed in a region not covered with the mask pattern 62. After the etching of the compressive strain film 45, the mask pattern 62 may be removed.

Figure 3E:
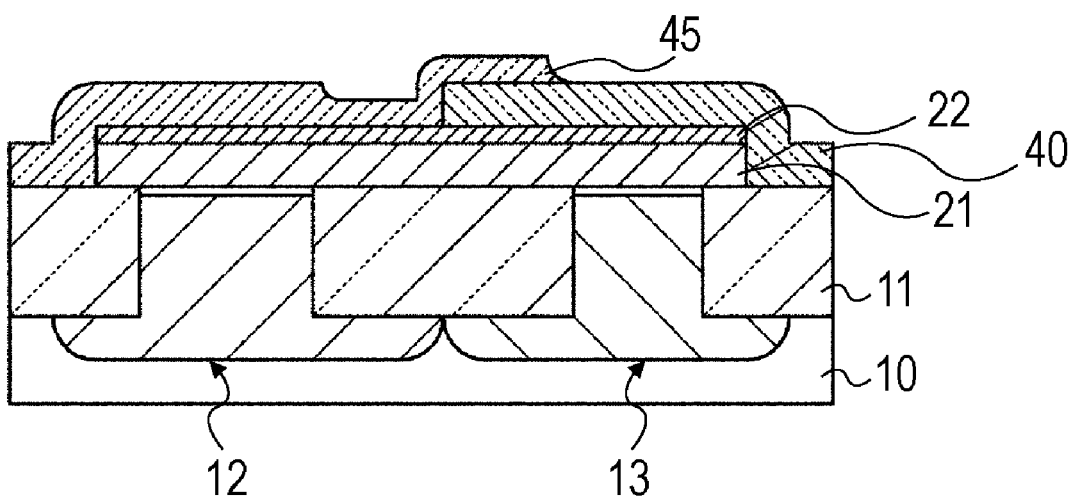

Referring to FIG. 3E, a structure in which the compressive strain film 45 extends over the tensile strain film 40 by a certain distance from the edge of the tensile strain film 40 is achieved. The following process may be substantially the same as the process of forming the interlayer insulating film 50 as depicted in FIG. 1M and the subsequent process of the first embodiment.

The compressive strain film 45 at a portion that overlaps with the tensile strain film 40 may be thinner than the compressive strain film 45 above the PMOS active region 12 as the first embodiment. The compressive strain film 45 at a portion extending from the portion of the compressive strain film 45 that overlaps with the tensile strain film 40 may be also thinner than the compressive strain film 45 above the PMOS active region 12.

In FIG. 3B, even if the positional displacement of the mask pattern 60 relative to the tensile strain film 40 occurs, the original thick compressive strain film 45 is not left on the tensile strain film 40. Accordingly, substantially the same advantage as in the first embodiment may be provided.

In the first embodiment, as depicted in FIG. 1K, the etching for removing the compressive strain film 45 above the NMOS active region 13 and the etching for thinning the compressive strain film 45 at a portion that overlaps with the tensile strain film 40 have been conducted in substantially the same process. In contrast, in the second embodiment, the compressive strain film 45 may be thinned in the etching in FIG. 3B and the compressive strain film 45 above the NMOS active region 13 may be separately removed in the etching in FIG. 3D. Therefore, the thickness T3 and T4 in FIG. 2 may be easily controlled compared with the first embodiment.

Third Embodiment

A method for manufacturing a semiconductor device according to a third embodiment will be described with reference to FIGS. 4A to 4F.

Figure 4A:
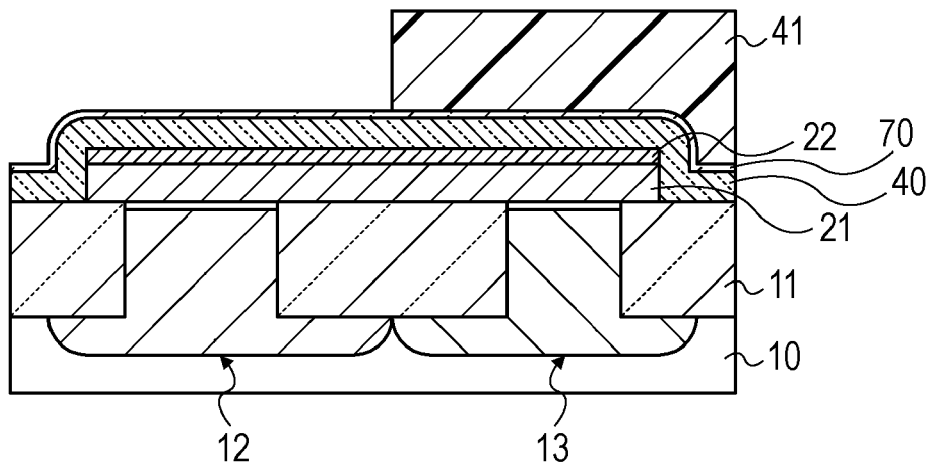
FIGS. 4A to 4F are views for describing a method for manufacturing a semiconductor device according to a third embodiment.

The process conducted until the formation of the tensile strain film 40 in FIG. 4A may be substantially the same as the conducted until the formation of the tensile strain film 40 in FIG. 1E of the first embodiment.

Referring to FIG. 4A, an etching stop film 70 may be formed on the tensile strain film 40. A material having etching resistance different from that of the compressive strain film 45 to be formed on the etching stop film 70 in a later process may be used as the etching stop film 70. Examples of the material include silicon oxide. The thickness of the etching stop film 70 may be about 30 nm.

A mask pattern 41 that covers substantially the same region as the mask pattern 41 in FIG. 1E of the first embodiment may be formed on the etching stop film 70. The etching stop film 70 and the tensile strain film 40 may be etched using the mask pattern 41 as an etching mask.

Figure 4B:
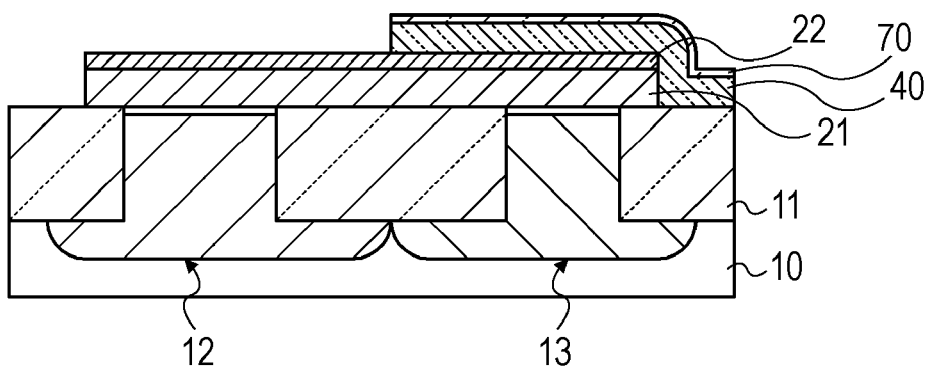

Referring to FIG. 4B, a layered structure of the tensile strain film 40 and the etching stop film 70 may be left above the NMOS active region 13.

Figure 4C:
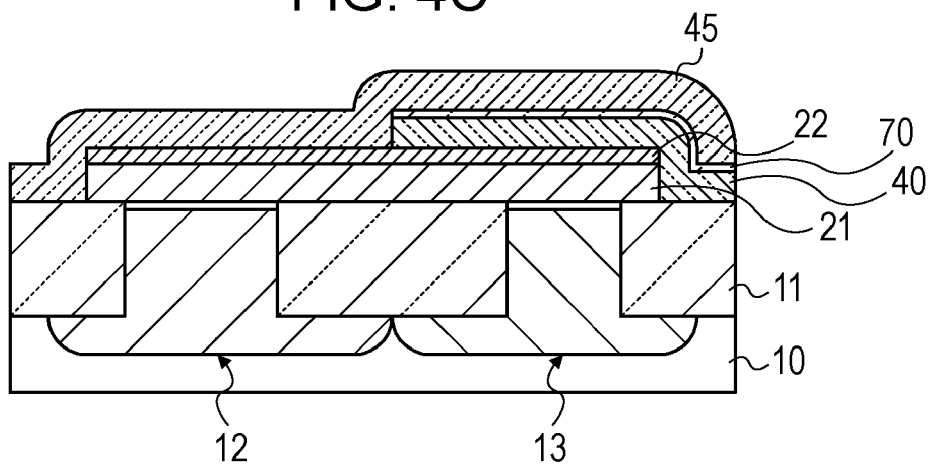

Referring to FIG. 4C, substantially the same compressive strain film 45 as depicted in FIG. 1G of the first embodiment may be formed.

Figure 4D:
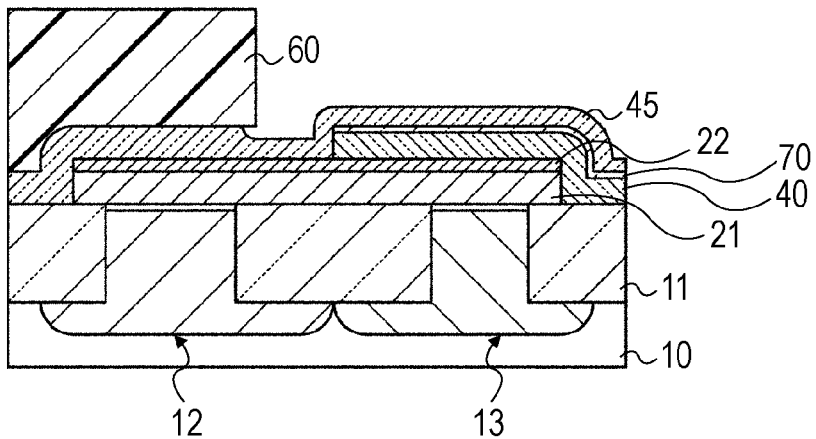

Referring to FIG. 4D, the compressive strain film 45 may be etched to the intermediate position in the thickness direction thereof using a mask pattern 60 formed on the compressive strain film 45 as an etching mask. The mask pattern 60 covers substantially the same region as the mask pattern 60 used in FIG. 3A of the second embodiment. After the compressive strain film 45 may be thinned, the mask pattern 60 may be removed.

Figure 4E:
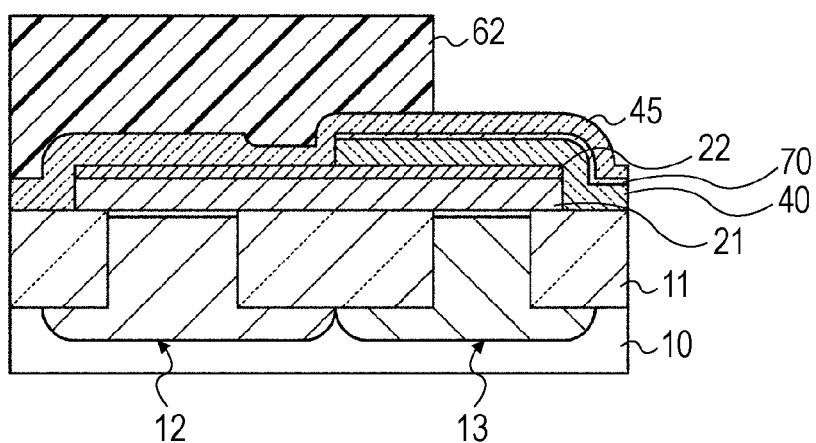

Referring to FIG. 4E, a mask pattern 62 may be formed on the compressive strain film 45. The mask pattern 62 covers substantially the same region as the mask pattern 62 in FIG. 3C of the second embodiment.

Figure 4F:
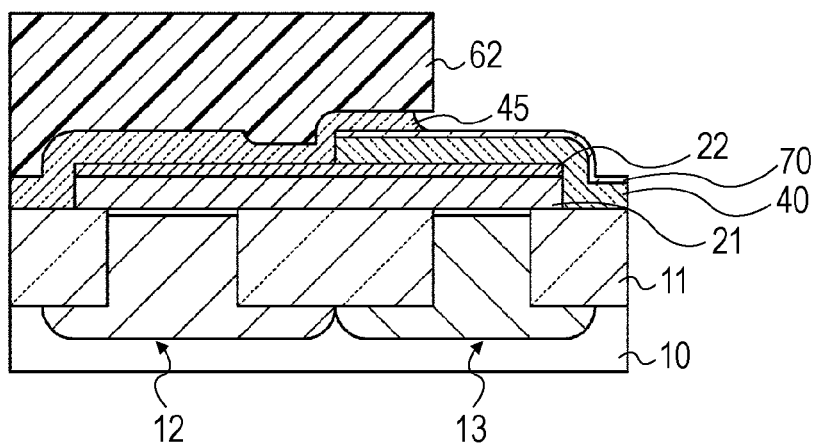

Referring to FIG. 4F, the compressive strain film 45 may be etched using the mask pattern 62 as an etching mask. This etching may be conducted under the conditions under which the etching rate of the etching stop film 70 may be lower than that of the compressive strain film 45. Thus, the etching may be stopped with good reproducibility when the etching stop film 70 may be exposed, which can prevent a decrease in the film thickness of the tensile strain film 40. After the etching of the compressive strain film 45, the mask pattern 62 may be removed. The following process may be substantially the same as the process conducted after the process in FIG. 3E of the second embodiment. After the etching of the compressive strain film 45, the exposed etching stop film 70 may be removed by etching.

Fourth Embodiment

A method for manufacturing a semiconductor device according to a fourth embodiment will be described with reference to FIGS. 5A to 5E.

Figure 5A:
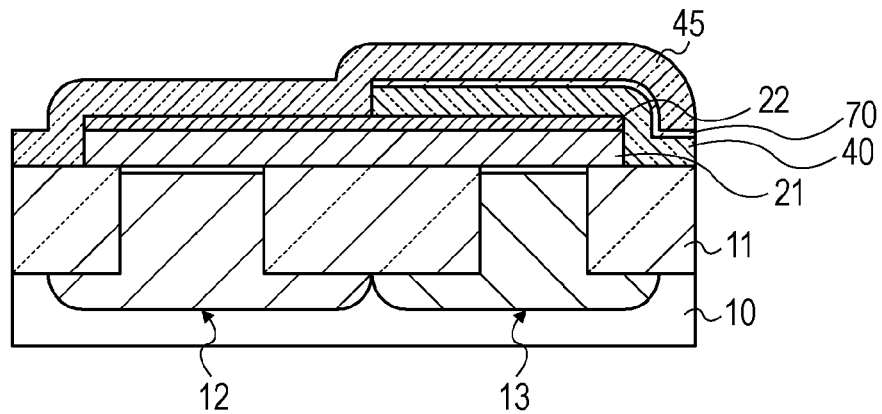
FIGS. 5A to 5E are views for describing a method for manufacturing a semiconductor device according to a fourth embodiment.

The process conducted until the formation of the compressive strain film 45 in FIG. 5A may be substantially the same as the conducted until the formation of the compressive strain film 45 in FIG. 4C of the third embodiment.

Figure 5B:
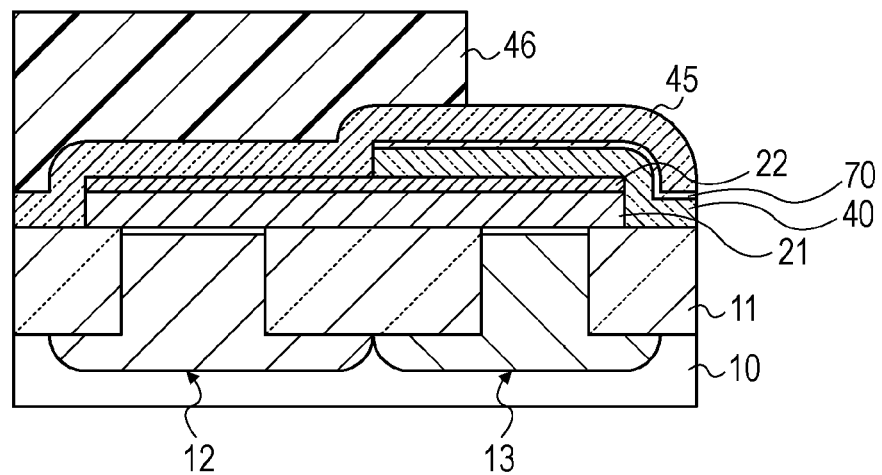

Referring to FIG. 5B, a mask pattern 46 may be formed on the compressive strain film 45. The mask pattern 46 covers substantially the same region as the mask pattern 46 in FIG. 1H of the first embodiment.

Figure 5C:
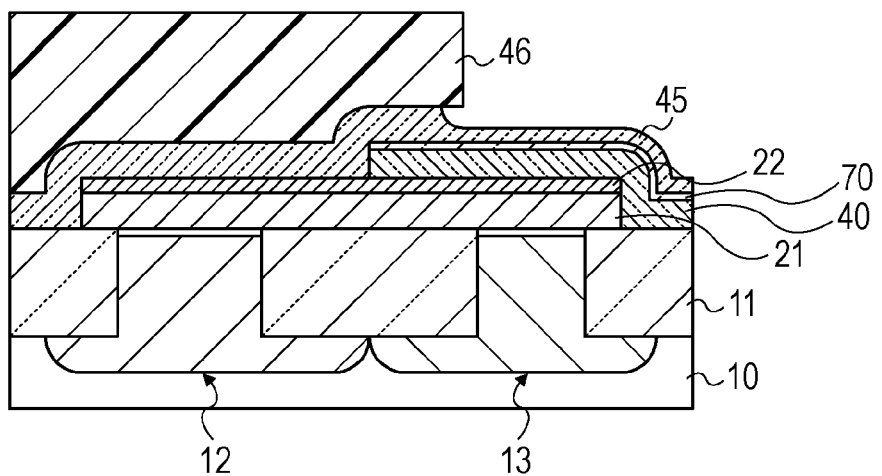

Referring to FIG. 5C, the compressive strain film 45 may be etched to the intermediate position in the thickness direction thereof using the mask pattern 46 as an etching mask. After the etching, the mask pattern 46 may be removed.

Figure 5D:
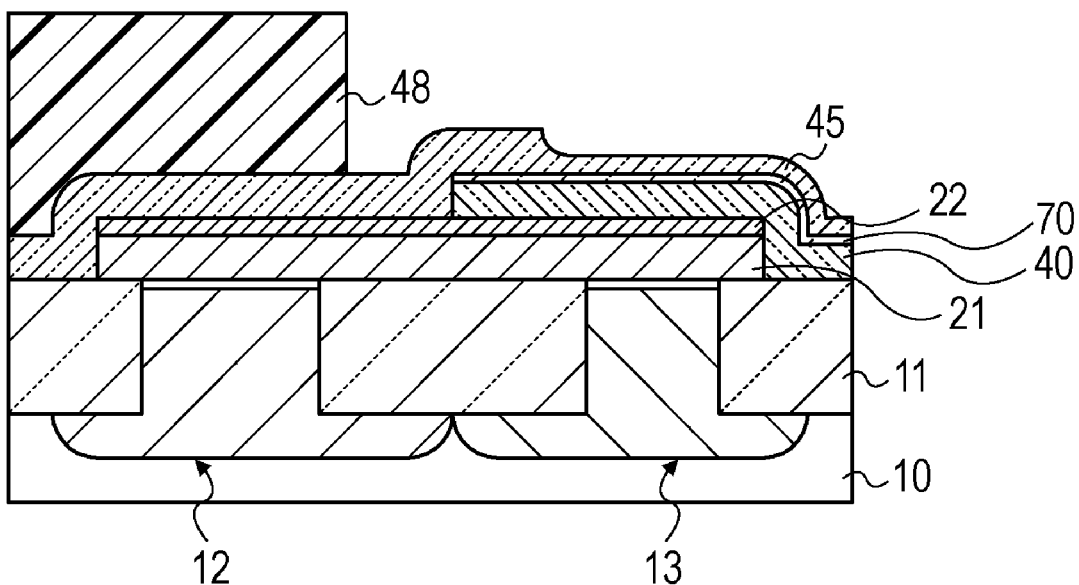

Referring to FIG. 5D, a mask pattern 48 may be formed on the compressive strain film 45. The mask pattern 48 covers substantially the same region as the mask pattern 48 in FIG. 1J of the first embodiment.

Figure 5E:
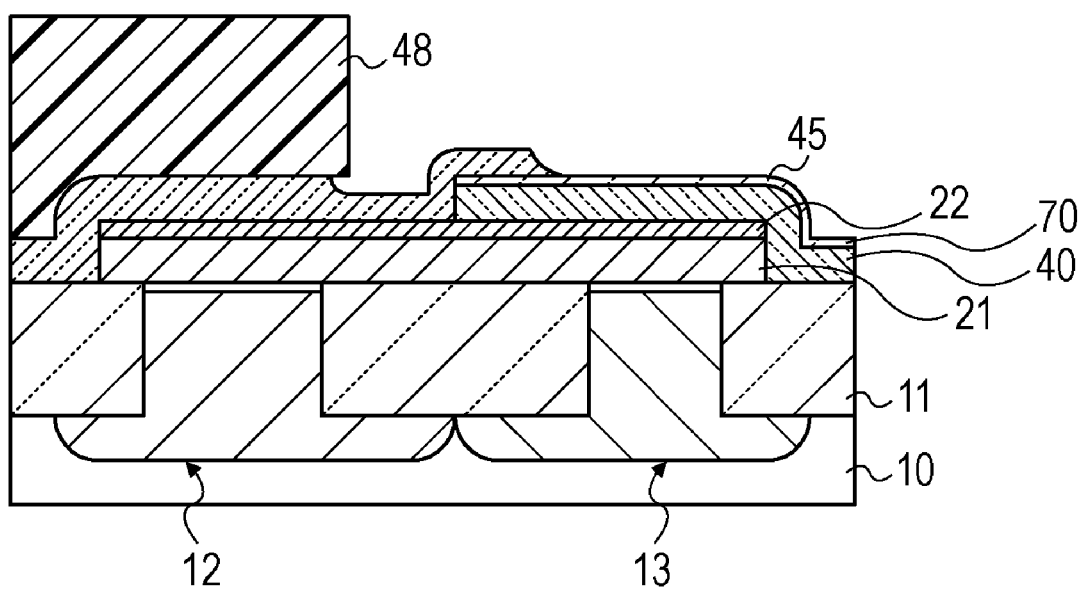

Referring to FIG. 5E, the compressive strain film 45 may be etched using the mask pattern 48 as an etching mask. The etching conditions may be substantially the same as those of the compressive strain film 45 in FIG. 1K of the first embodiment. The etching rate of the etching stop film 70 may be lower than that of the compressive strain film 45, which may prevent a decrease in the film thickness of the tensile strain film 40 formed under the etching stop film 70. After the etching of the compressive strain film 45, the mask pattern 48 may be removed. The following process may be substantially the same as depicted in FIG. 1L and the subsequent process of the first embodiment.

Fifth Embodiment

Figure 6:
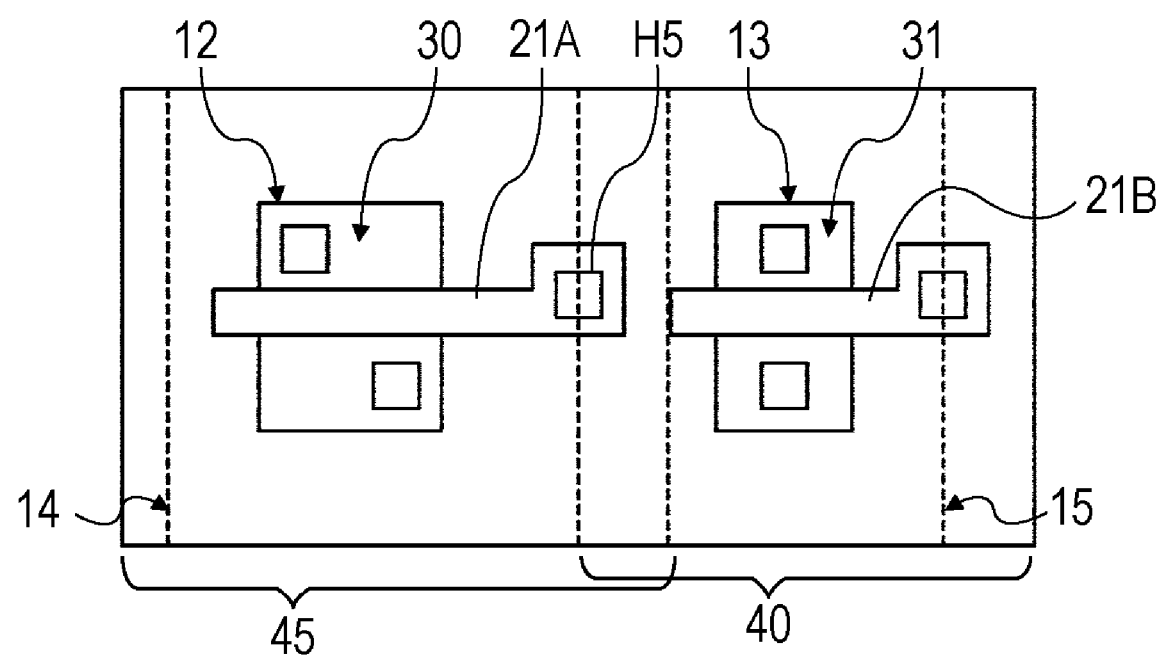
FIG. 6 is a plan view of a semiconductor device according to a fifth embodiment.

FIG. 6 is a plan view of a semiconductor device according to a fifth embodiment. The difference from the plan view depicted in FIG. 1N of the first embodiment will be described.

In the first embodiment, the gate electrode 21 of the PMOSFET 30 and the gate electrode 21 of the NMOSFET 31 have the single gate pattern 23. In the fifth embodiment, a gate electrode 21A of the PMOSFET 30 may be separated from a gate electrode 21B of the NMOSFET 31.

A via hole H5 for a conductive plug that may be connected to the gate electrode 21A of the PMOSFET 30 extends through the edge of the tensile strain film 40. Even if the gate electrode 21A of the PMOSFET 30 may be separated from the gate electrode 21B of the NMOSFET 31, a structure similar to the structures of the first to fourth embodiments may be adopted.

In the first to fifth embodiments described above, after the tensile strain film 40 has been formed, the compressive strain film 45 has been formed. However, the order may be reversed. In this case, across the first to fifth embodiments, the terms PMOS active region 12 and PMOSFET 30 may be changed to an NMOS active region and an NMOSFET, respectively. The terms NMOS active region 13 and NMOSFET 31 are changed to a PMOS active region and a PMOSFET, respectively. In addition, the term tensile strain film 40 may be changed to a compressive strain film and the term compressive strain film 45 may be changed to a tensile strain film.

In the first to fifth embodiments described above, silicon nitride has been used for the tensile strain film 40 and the compressive strain film 45, but other insulating materials may be used. For example, silicon oxide may be used even though it is inferior to silicon nitride in terms of magnitude of stress that may be applied.

One mask pattern overlaps with a first strain film while the other mask pattern may be separated from the first strain film. Thus, there may be a larger margin of position adjustment than the case where the ends of the mask patterns are aligned along the edge of the first strain film. Even if positional displacement occurs, the film thickness of the overlap portion of the two strain films does not become excessively large and a space between the two strain films is not created.

Although the present invention has been described in accordance with the embodiments, the present invention is not limited to these embodiments. For example, it is obvious for a person skilled in the art that various modifications, improvements, combinations, and the like can be made.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A semiconductor device, comprising:
a semiconductor substrate;
a first MISFET having a channel of a first conduction type and formed on the semiconductor substrate;
a second MISFET having a channel of a second conduction type that is opposite to the first conduction type and formed on the semiconductor substrate;
an isolation region between the first MISFET and the second MISFET;
a first film having a first strain, the first film covering a region where the second MISFET is disposed but not a region where the first MISFET is disposed;
a second film having a second strain whose type is opposite to a type of the first strain, the second film covering the region where the first MISFET is disposed but not the region where the second MISFET is disposed; and
an interlayer insulating film disposed on the first film and the second film; and
a conductive plug extending through the interlayer insulating film over the isolation region;
wherein the second film includes a first portion which has a first thickness, a second portion which is provided over the isolation region at a side closer to the second MISFET and has a second thickness being thinner than the first thickness, and a third portion which is provided over the first film and the isolation region,
wherein the first film includes a fourth portion which has a third thickness being thicker than the second thickness.

2. The semiconductor device according to claim 1, wherein the second MISFET is an n-channel MISFET and the first strain film has a tensile strain.

3. The semiconductor device according to claim 1, wherein the second MISFET is a p-channel MISFET and the first strain film has a compressive strain.

4. The semiconductor device according to claim 1, wherein the conductive plug is provided between the second portion and the third portion.

* * * * *